United States Patent [19]

Shibib

[11] Patent Number: 5,728,607
[45] Date of Patent: Mar. 17, 1998

[54] METHOD OF MAKING A P-CHANNEL BIPOLAR TRANSISTOR

[75] Inventor: Muhammed Ayman Shibib, Wyomissing, Pa.

[73] Assignee: Lucent Technologies Inc., Murray Hill, N.J.

[21] Appl. No.: 754,607

[22] Filed: Nov. 20, 1996

[51] Int. Cl.[6] .................. H01L 21/265; H01L 21/70; H01L 21/00
[52] U.S. Cl. ........................................... 438/135; 438/140
[58] Field of Search .......................... 437/6, 31, 40 DM, 437/41 DM, 62, 59, 32

[56] References Cited

U.S. PATENT DOCUMENTS

| | | | |
|---|---|---|---|
| 5,023,678 | 6/1991 | Kinzer | 357/23.4 |
| 5,246,877 | 9/1993 | Hisamoto et al. | 437/62 |
| 5,360,987 | 11/1994 | Shibib | 257/446 |
| 5,501,994 | 3/1996 | Mei | 437/40 DM |

*Primary Examiner*—Brian Dutton

[57] ABSTRACT

The specification describes a p-channel IGBT with improved performance attributable to a vertical underlying n-p-n structure, and fabricated by a process that is fully compatible with simultaneously forming complementary MOS and TGBT devices.

2 Claims, 8 Drawing Sheets n-CHANNEL DMOS p-CHANNEL MOS n-CHANNEL IGBT p-CHANNEL IGBT n-CHANNEL DMOS p-CHANNEL MOS n-CHANNEL IGBT p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS n-CHANNEL IGBT p-CHANNEL MOS p-CHANNEL IGBT n-CHANNEL DMOS p-CHANNEL MOS n-CHANNEL IGBT p-CHANNEL IGBT n-CHANNEL DMOS p-CHANNEL MOS n-CHANNEL IGBT p-CHANNEL IGBT n-CHANNEL DMOS p-CHANNEL MOS n-CHANNEL IGBT p-CHANNEL IGBT

METHOD OF MAKING A P-CHANNEL BIPOLAR TRANSISTOR

FIELD OF THE INVENTION

The field of this invention is insulated gate bipolar transistor (IGBT) fabrication in high voltage dielectrically isolated BiCMOS technology wherein the fabrication of improved p-channel IGBT devices is fully compatible with the fabrication of complementary IGBT pairs and CMOS devices.

BACKGROUND OF THE INVENTION

P-Channel IGBTs are important devices for use as high side switches on inverters, especially where it is important to handle a high blocking voltage and an appreciable current in the on-state. These devices can also be used where high voltage PMOS devices are used if the switching frequency is below typically 100 KHz.

Conventional p-channel IGBT devices are either vertical in structure, or lateral. Lateral structures are typically preferred due to fabrication compatibility with other devices. In the lateral p-channel IGBT device the underlying n-p-n transistor is a lateral transistor with a relatively wide base and low current gain. Lateral bipolar transistors in these types of structures typically are relatively inefficient, with current gains of less than 10, and have high on-resistance.

Bipolar n-p-n structures with higher efficiencies are known in the art but thus far the lateral device just described is preferred due to the compatibility of the lateral structure with the overall IC fabrication process. Process compatibility is clearly the device design driver in state of the art IC technology.

IGBT devices in state of the art circuits are used in complementary pairs, and are typically combined with CMOS devices in the same IC. Thus it essential that the fabrication sequence for different devices be compatible. It is highly desirable that the fabrication sequence be largely the same for each species of device. It will be appreciated by those skilled in the art that this process compatibility places severe limitations on the design and processing of the different species of devices. An improved design for a species of device will often not be implemented if it is incompatible with the sequence of fabrication steps. However, design improvements that do not involve sequence incompatibility are constantly being sought even if they add a step to the process.

STATEMENT OF THE INVENTION

I have developed an improved p-channel IGBT device design that is fully compatible with an efficient and reliable dielectrically isolated BiCMOS fabrication process for complementary IGBTs and CMOS devices. The improved p-channel IGBT has a vertical underlying n-p-n transistor which improves the current handling capability of the device as well as lowering the device on-resistance. Improvement in current handling capability by a factor of 30 has been demonstrated when compared with a typical high voltage PMOS device. On resistance in the improved device of less than 100 ohms has been measured which compares with an on-resistance of several thousand ohms for a typical high voltage p-channel MOS device.

DETAILED DESCRIPTION

Figure 1:
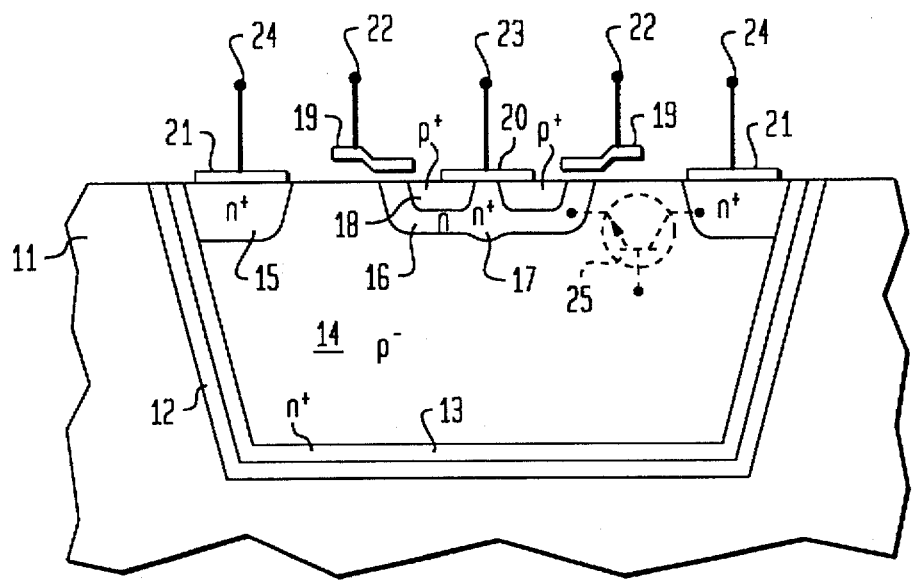
FIG. 1 is a schematic view of a p-channel IGBT with a lateral underlying n-p-n device.

Referring to FIG. 1 the basic dielectrically isolated structure is shown with polysilicon substrate 11 surrounding the oxide isolating layer 12 and the silicon device substrate 14 within the dielectric layer. This structure is formed by grooving a single crystal silicon wafer, growing the thick oxide dielectric, depositing polysilicon over the grown dielectric, inverting the structure, and grinding the silicon to a thickness level that leaves the isolated silicon regions as shown. The techniques used to form dielectrically isolated silicon wafers are well established in the art. The dielectrically isolated structure shown is one of thousands in a typical DI silicon wafer. The n+ layer 13 is a conventional guard ring layer formed in this technology over the whole structure prior to growing the oxide layer 12. The silicon substrate 14 is standard lightly doped n-type material.

As in the usual CMOS process the p-channel devices are formed in p-tubs 14. The drain regions are shown at 15 and the source consists of n-regions 16 and 17, and p+ regions 18. The silicon gates are shown at 19 and the source and drain electrodes at 20 and 21. The interconnections for the gate, source and drain are shown schematically as 22, 23 and 24. The lateral n-p-n in this structure is indicated at 25 and has a wide base region separating the n-emitter 16 and the n-collector 15.

Figure 2:
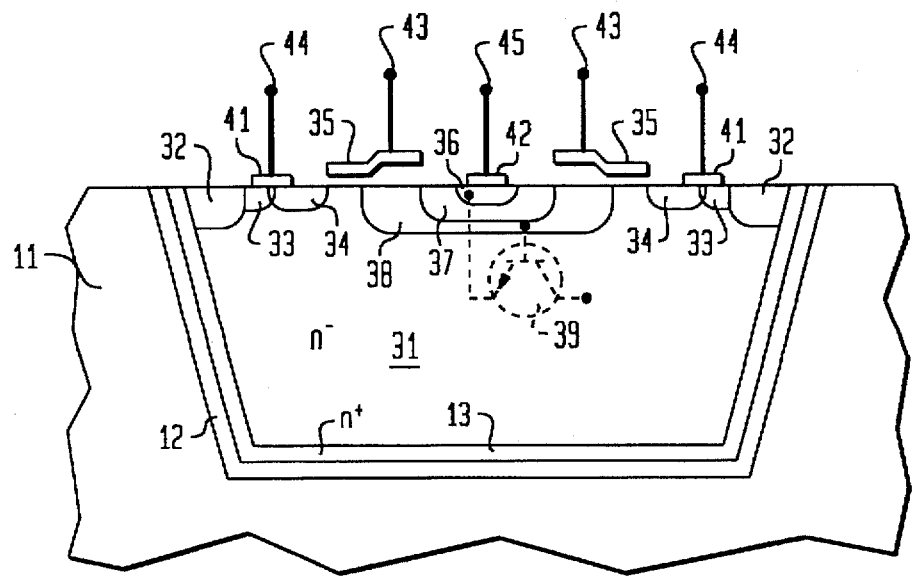
FIG. 2 is a schematic view similar to FIG. 1 showing the structure of a p-channel IGBT with a vertical n-p-n transistor according to the invention.
Figure 3A:
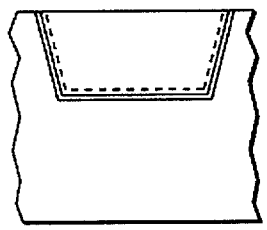
FIGS. 3A–3D are schematic representations of a portion of a substrate wafer being processed according to the invention and shows the break away format used in the subsequent process step representations.
Figure 3C:
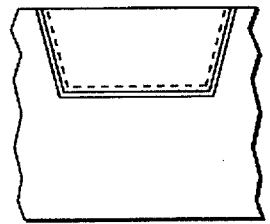
Figure 3B:
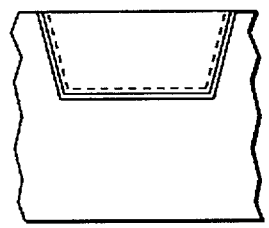
Figure 3D:
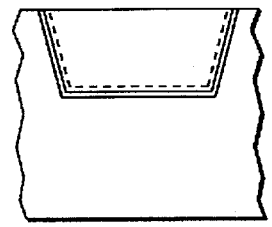
Figure 4A:
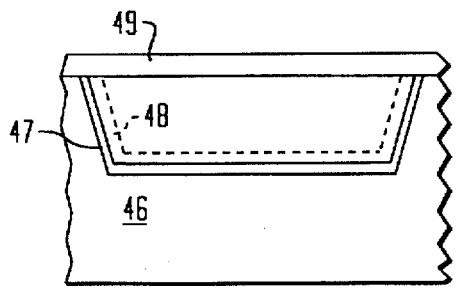
FIGS. 4A–4D, 5A–5D, 6A–6D, 7A–7D, 8A–8D, 9A–9D, 10A–10D, 11A–11D, 12A–12D, 13A–13D, 14A–14D, and 15A–15D are schematic representations of the process step sequence of the invention showing the process sequence compatibility and the process step commonality for four types of devices being fabricated simultaneously.
Figure 4C:
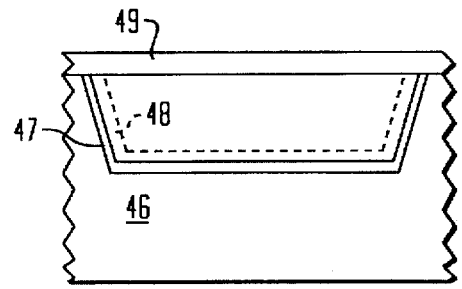
Figure 4B:
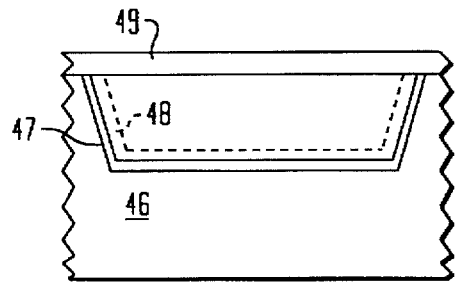
Figure 4D:
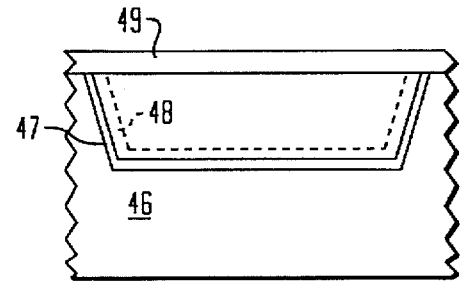
Figure 5A:
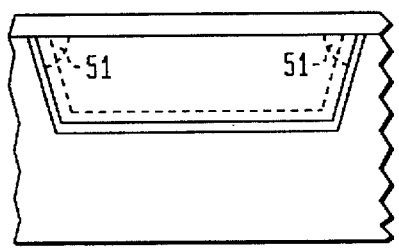
Figure 5B:
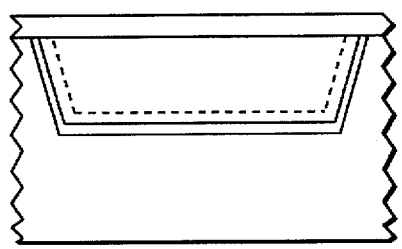
Figure 5C:
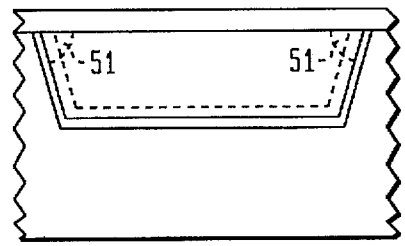
Figure 5D:
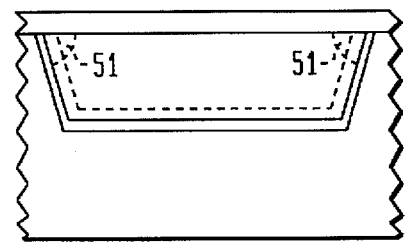
Figure 6A:
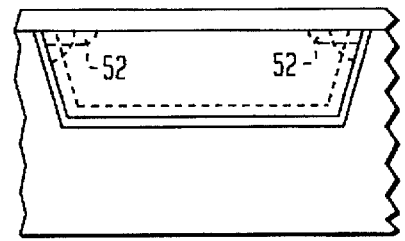
Figure 6B:
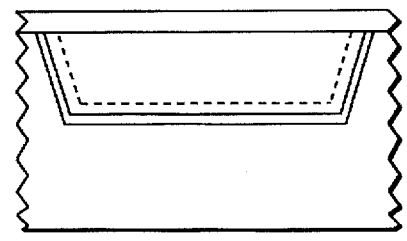
Figure 6C:
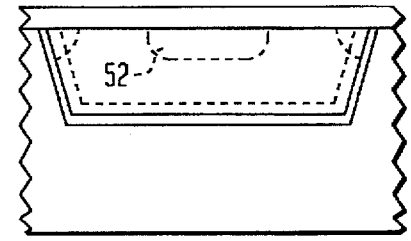
Figure 6D:
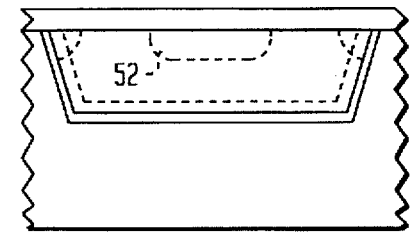
Figure 7A:
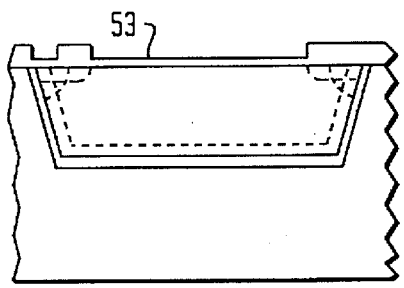
Figure 7B:
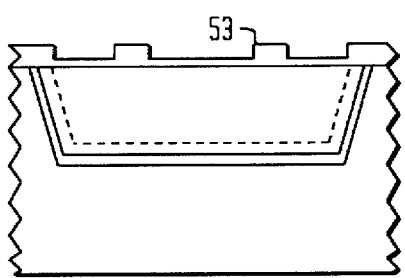
Figure 7C:
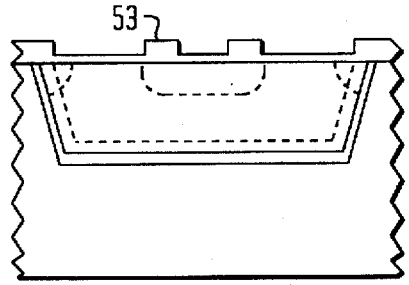
Figure 7D:
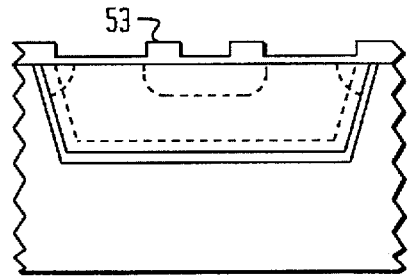
Figure 8A:
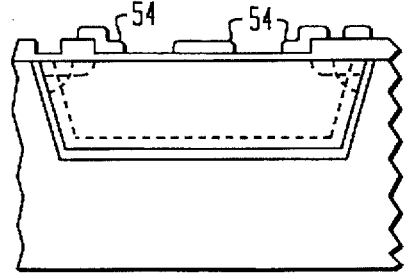
Figure 8B:
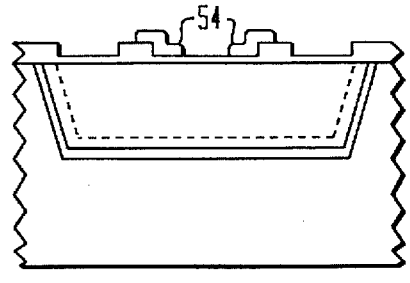
Figure 8C:
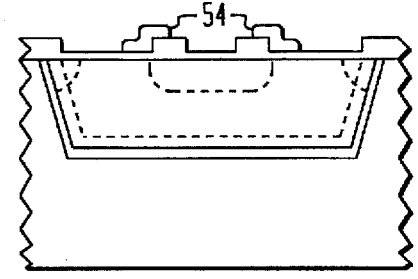
Figure 8D:
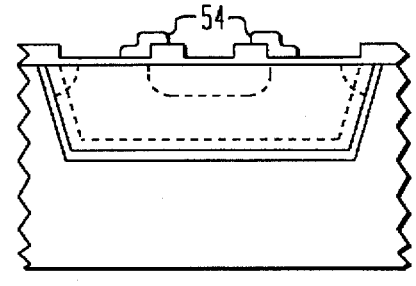
Figure 9A:
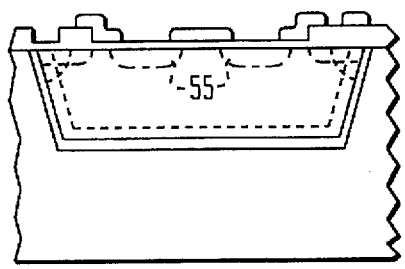
Figure 9B:
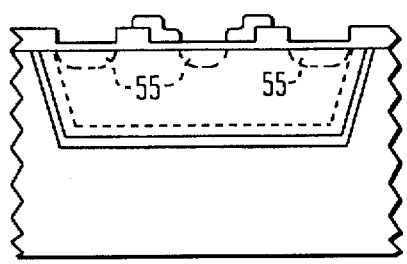
Figure 9C:
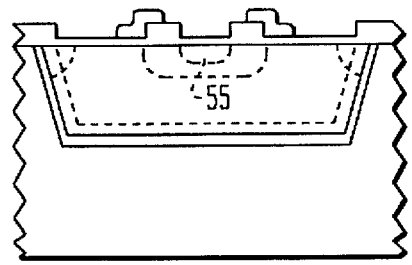
Figure 9D:
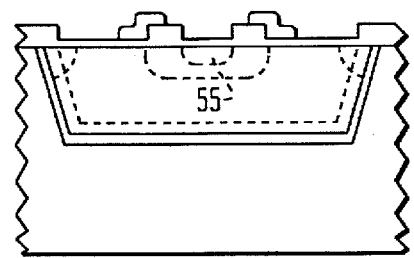
Figure 10A:
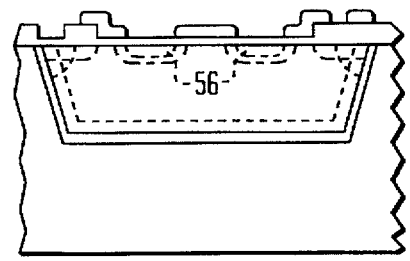
Figure 10B:
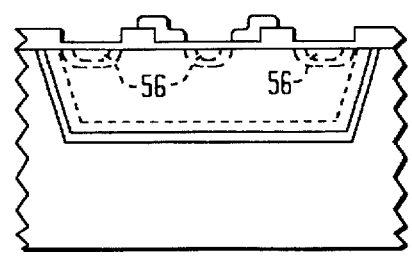
Figure 10C:
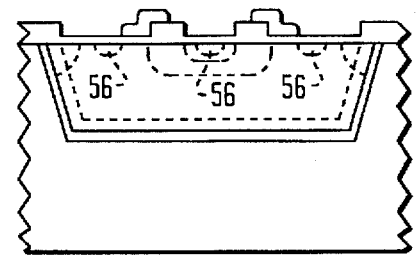
Figure 10D:
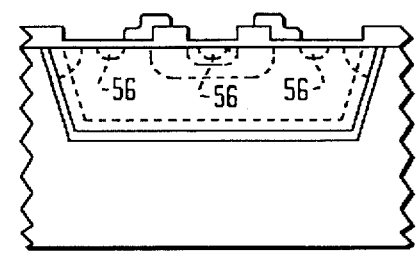
Figure 11A:
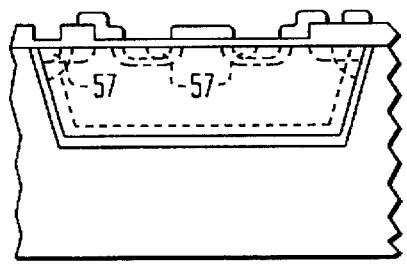
Figure 11B:
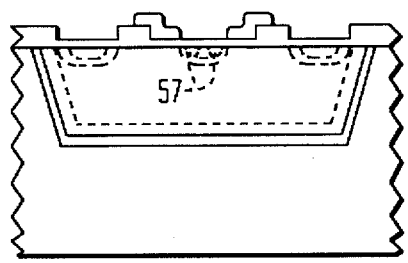
Figure 11C:
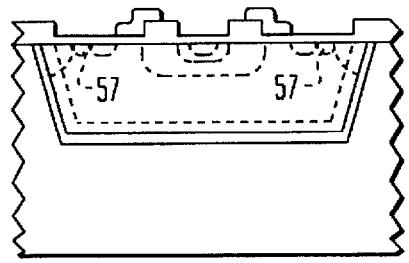
Figure 11D:
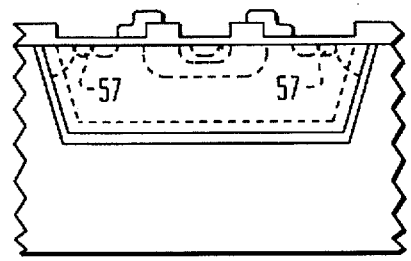
Figure 12A:
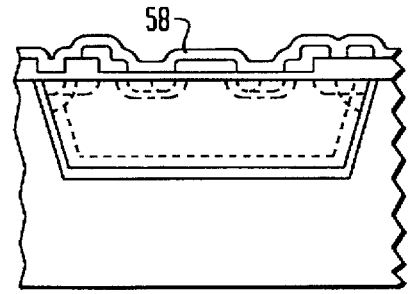
Figure 12B:
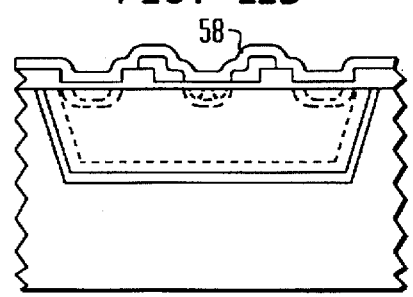
Figure 12C:
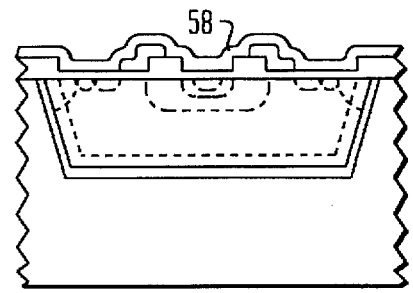
Figure 12D:
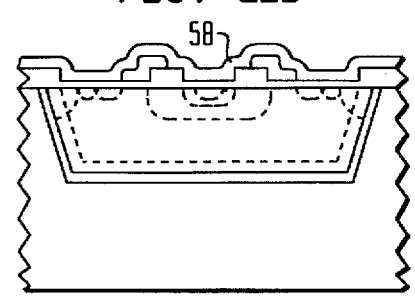
Figure 13A:
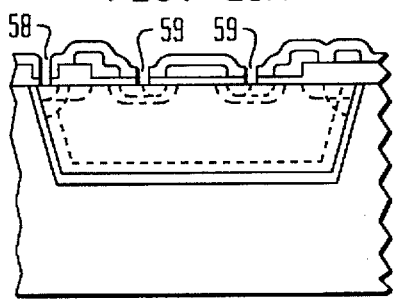
Figure 13C:
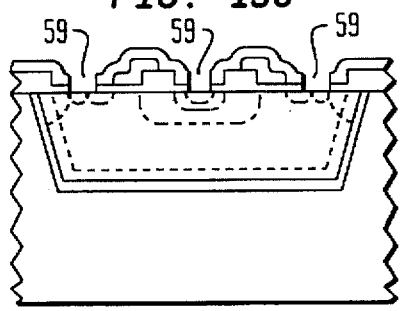
Figure 13B:
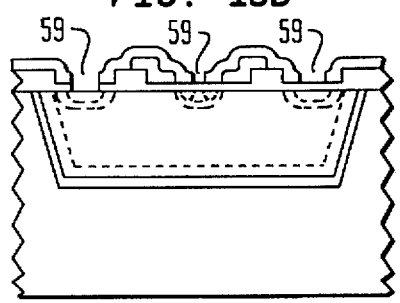
Figure 13D:
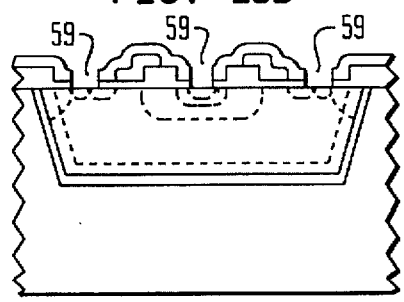
Figure 14A:
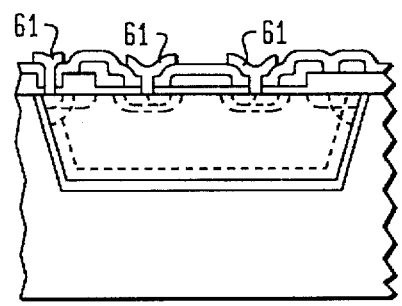
Figure 14C:
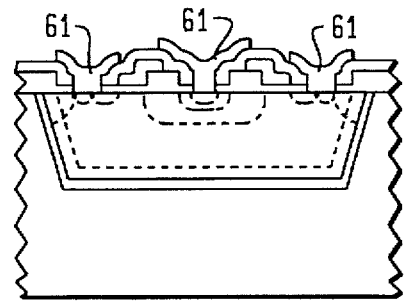
Figure 14B:
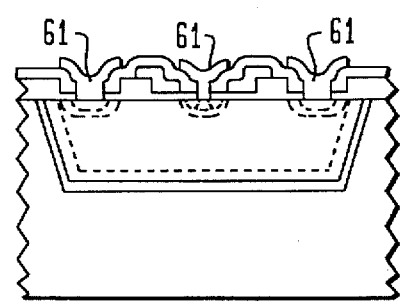
Figure 14D:
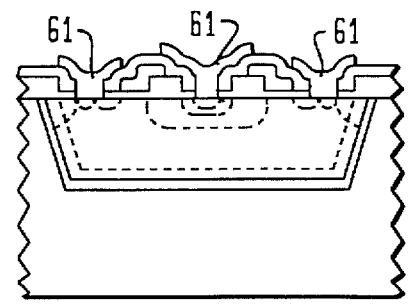
Figure 15A:
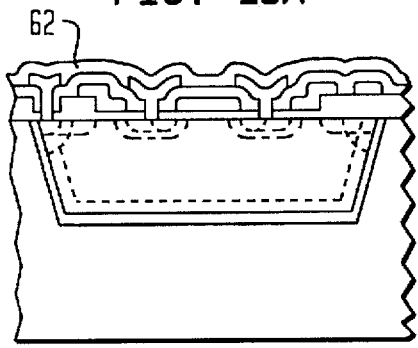
Figure 15C:
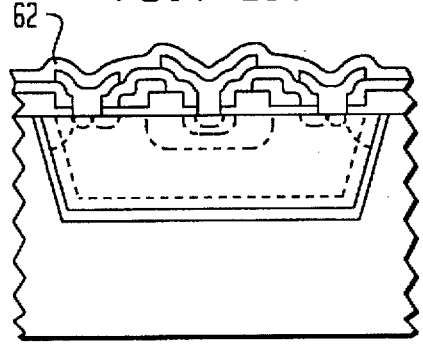
Figure 15B:
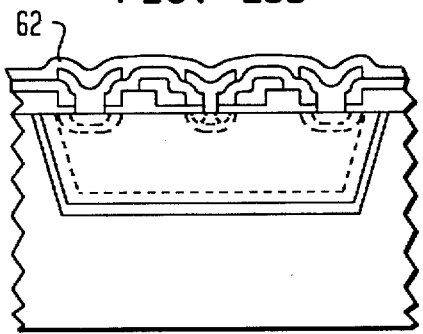
Figure 15D:
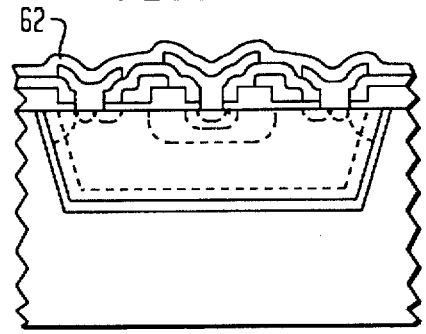

An improved p-channel IGBT structure according to the invention is shown in FIG. 2. For process compatibility, as will be more fully appreciated in the process sequence described below, the p-channel device in this process is formed in an n-tub 31. The substrate 11, dielectric isolation oxide 12, and guard region 13, are essentially the same as in FIG. 1. A peripheral n+ guard region 32 is formed at the edge of the tub as shown. The source in this structure comprises n region 33, and p+ region 34. The p+ source regions is self aligned to the silicon gates 35. The drain comprises n+ region 36 and surrounding p buffer region 37, which is formed in the implant step usually referred to as the p-body implant, and p drift region 38, which is formed with the step usually referred to as p-resurf. The lateral n-p-n transistor in this structure is shown at 39. The source electrodes are shown at 41, the drain electrodes at 42 and the gate, source and drain interconnections, again shown schematically, at 43, 44, and 45.

An important aspect of the invention is the compatibility of the process for making the p-channel device of FIG. 2 with a process for making a complementary IGBT, and for making high voltage MOS complementary pairs using the same process sequence. Accordingly, the following process description shows the simultaneous formation of four device varieties: p-channel IGBT, n-channel IGBT, p-channel MOS and n-channel DMOS. Each device is shown in each figure broken apart for clarity. In FIG. 3, the four devices are shown as a single substrate with the break marks as indicated to illustrate the format used in the subsequent process sequence. The varieties of devices shown in the figure is by way of example only, as is the order in which the devices are placed. A typical high voltage IC will have hundreds of devices arranged according to the IC design.

Referring to FIG. 4, shown is the polysilicon substrate 46, with the conventional dielectric isolation regions formed by oxide 47, and guard layer 48. The substrate material within the dielectrically isolated tubs is <100> oriented silicon doped n⁻. After standard cleaning, an initial oxide layer 49, 0.5 to 1.0 μ thick, is grown on the silicon surface by steam oxidation.

FIG. 5 shows $n^+$ regions 51 in the selected devices shown to form $n^+$ contacts. In this example, the $n^+$ regions are formed by photomasking the oxide above the $n^+$ region, etching the exposed areas with hot HF, followed by a phosphorus predeposit and wet oxidation drive.

It will be understood by those skilled in the art that those process steps described here that require selective processing can be achieved by well known photolithographic masking techniques, and standard etching, ion implantation, oxide growth or deposition as required, metal deposition and patterning, etc. These various process steps are sufficiently established in the IC wafer fabrication art that the details are unnecessary to the practice of the invention. For those details, reference is made to Tomohide Terashima et al, "Over 1000 V n-ch LDMOSFET and p-ch LIGBT with JI RESURF Structure and Multiple Floating Field Plate", Proceedings of the 1995 International Symposium on Power Semiconductor Devices & ICs, Yokohama, pp. 11.2, 1995; M. Ayman Shibib et al, "A Cost-Effective Smart Power BiCMOS Technology", Proceedings of the 7th International Symposium on Power Semiconductor Devices & ICs, Yokohama, pp. 48–53, 1995.

It is also understood that the elements in the figures are not drawn to scale, or in some cases, in the interest of clarity, not even approaching scale. The figures are schematic front sectional views and show certain elements, e.g. polysilicon gates, as two separate bodies. Those skilled in the art of power transistors understand that elements of these devices are circular shaped, or shaped in a polygon for close packing in an array.

Also for clarity, the reference numerals in each figure denote the elements that are added or changed in the process step associated with that figure. In most cases the masking layer is not shown, or is not shown patterned.

In FIG. 6 the so-called p-resurf layer 52 is formed. Details of the purpose and formation of this layer are given by J. A. Appels and H. M. Jaes, "High Voltage Thin Layer Devices (Resurf Devices)", IEDM Tech. Dig., pp. 238–241, 1979. In the process of this invention the p-resurf layer defines the p-drift region for the improved p-channel IGBT layer and also, in combination with steps to follow, defines the base region of the vertical n-p-n underlying transistor. The p-resurf layer 52 is formed in this example by boron implant at a dose of 5.5 E12 and energy of 30 kEV, followed by a drive for 60 min. at 1200° C. The p-resurf formation is followed by a wet oxidation at 1150° C. for approximately 6 hours to form approximately 2 μ of field oxide as shown in FIG. 7. The oxide layer is patterned and the thin oxide regions regrown to form the thick and thin oxide layer 53 of FIG. 7. The thin oxide regions form the gate dielectric for the MOS portions of the devices. The thickness of the thin oxide layer is typically 500–1000 Angstroms.

Next the polysilicon gates 54 are formed by depositing CVD polysilicon and patterning to produce the structure shown in FIG. 8. The polysilicon gates, in combination with the thin oxide regions form the alignment for the p-body implant shown in FIG. 9. In particular the polysilicon gate electrode ring in the n-channel devices self-aligns the implanted p-regions to the gate edge. The p-regions 55 are formed by conventional boron implant and drive. In this process the boron dose is 6.0 E13 at an implant energy of 60 kEV. Referring specifically to the p-channel IGBT, the p-body implant forms part of the drain region of the device. The p-body implant is followed by a shallow p-implant, 2.0 E15 at 60 kEV to form regions 56 in FIG. 10. The shallow p-implanted regions 56 form p+ contact regions and, for the p-channel IGBT, defines the source for the device.

The n-source regions for the n-channel devices, and the n-portion of the p-channel IGBT drain are formed at 57 in FIG. 11. A standard phosphorus implant, 3.0 E15 at 160 kEV, was used to form the n-regions shown. Next a p-glass layer 58 is deposited as shown in FIG. 12, and patterned as shown in FIG. 13 for the contact windows 59. Aluminum metallization is formed over the patterned structure of FIG. 13 and itself patterned to form electrodes 61 as shown in FIG. 14. A standard SINCAP layer 62, shown in FIG. 15, is deposited to passivate the final IC structure.

It is evident from the foregoing that the same process step sequence, with essentially total process commonality, was used to form each of four device varieties. Of significance to the invention, the p-channel IGBT device of FIG. 2, with improved vertical n-p-n transistor performance, was integrated with the process for the other devices without additional steps or process complexity.

Figure 16:
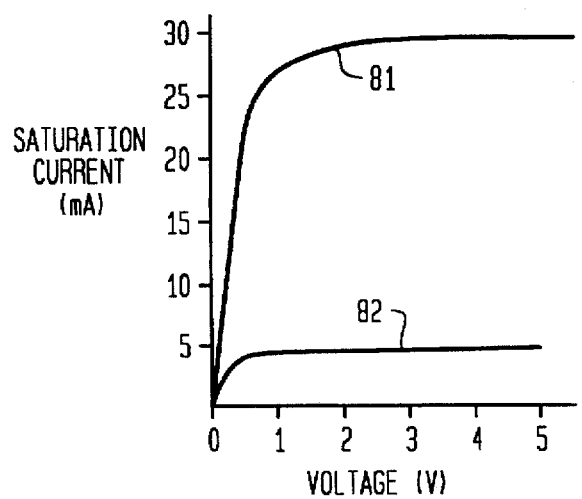
FIG. 16 is a plot comparing the saturation current of the improved p-channel IGBT with that of a comparison high voltage MOS device.

The performance of the p-channel IGBT was evaluated electrically, and compared with a standard high performance high voltage PMOS transistor. The comparison in terms of current handling capacity is shown in FIG. 16. Voltage in volts is plotted as abscissa and saturation current in mA as ordinate. Curve 81, with a saturation current of approximately 30 volts at VGS of 5 volts, was recorded for the device of the invention, compared with a saturation maximum of approximately 1 mA for curve 82, the comparison device. To verify the action of the vertical n-p-n transistor of the p-channel IGBT the current gain of the transistor was measured at a base current, $I_B$, of 1 mA. The resulting gain was 30. Consequently, if the comparison high voltage MOS device supplies a base current of 1 mA to the vertical n-p-n (at VGS=5 V), then with a gain of 30 the anode current is 30 mA as shown in FIG. 16 thus establishing the improved performance of the vertical n-p-n of the invention.

Figure 17:
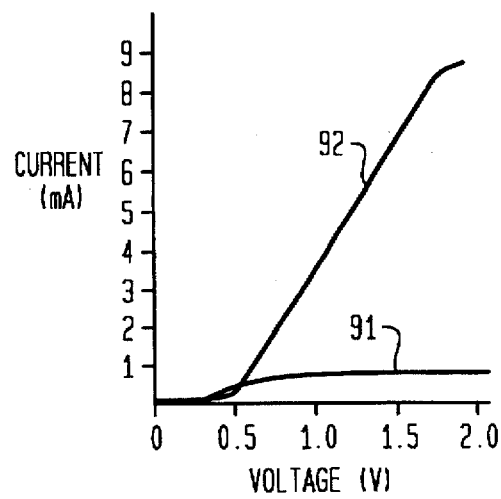
FIG. 17 is a plot showing a similar comparison for the on-resistance of the device.

With respect to the other important property, the on-resistance, a similar comparison was made. The result is given in FIG. 17, where the on-resistance for the comparison device is indicated by curve 91, and the on-resistance for the p-channel IGBT of the invention is shown by curve 92. The Ron for the comparison device is approximately 4000 Ω, while the on-resistance for the device of the invention is approximately 67 Ω.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A process for the simultaneous fabrication of complementary pairs of high voltage insulated gate bipolar transistors (IGBT) wherein the p-channel device of the complementary pair has an underlying vertical n-p-n transistor comprising the sequential steps of:

a. forming a plurality of dielectrically isolated n-type tubs, a first of said dielectrically isolated n-type tubs being designated for an n-channel IGBT (NC-IGBT) and designated the NC-IGBT tub and a second of said dielectrically isolated n-type tubs being designated for a p-channel IGBT (PC-IGBT) and designated the PC-IGBT tub, b. implanting n-type impurities into a selected region of said PC-IGBT tub adjacent the edge thereof to form a first FC-IGBT n-type region as part of the source contact for the PC-IGBT, c. implanting p-type impurities into a selected region in the center of said PC-IGBT tub, and spaced from said first PC-IGBT n-type region to form a first PC-IGBT p-type region as part of the PC-IGBT drain and as the base region for the underlying n-p-n transistor, d. forming a ring-shaped polysilicon MOS gate electrode in the center portion of both the NC-IGBT tub and the PC-IGBT tub, said MOS gate electrode in the PC-IGBT tub overlying the edge of said first PC-IGBT p-type region, e. implanting p-type impurities into both the PC-IGBT tub and the NC-IGBT tub to form simultaneously:
      i. a first NC-IGBT p-type region in the NC-IGBT tub, said region being circulary shaped and located in the center of the NC-IGBT tub and being implanted using the ring shaped polysilicon MOS electrode in the NC-IGBT tub as a mask,
      ii. a second NC-IGBT p-type region in the NC-IGBT tub, surrounding and spaced front said first NC-IGBT p-type region to form a portion of the NC-IGBT drain, and
      iii. a second PC-IGBT p-type region in the PC-IGBT tub, substantially contained within said first PC-IGBT p-type region to form a portion of the PC-IGBT drain, f. implanting p-type impurities into both the NC-IGBT tub and the PC-IGBT tub to form simultaneously:
      i. a third NC-IGBT p-type region in the NC-IGBT tub substantially contained within said second NC-IGBT p-region to form a portion of the NC-IGBT drain,
      ii. a fourth NC-IGBT p-type region in the NC-IGBT tub substantially contained within said first NC-IGBT p-type region to form a portion of the NC-IGBT source,
      iii. a third PC-IGBT p-type region in the PC-IGBT tub in the space between said first PC-IGBT p-type region of the PC-IGBT and the first PC-IGBT n-type region of the PC-IGBT to form a portion of the PC-IGBT source, and to define the MOS channel region of the PC-IGBT between said first PC-IGBT p-type region and said third PC-IGBT p-type region, said third PC-IGBT p-type region being implanted using the PC-IGBT polysilicon gate MOS electrode as part of the mask, g. implanting n-type impurities into both the NC-IGBT tub and the PC-IGBT tub to form simultaneously:
      i. a first NC-IGBT n-type region substantially contained within said first NC-IGBT p-type region in the NC-IGBT tub and abutting said fourth NC-IGBT p-type region of the NC-IGBT tub, to form a portion of the NC-IGBT emitter,
      ii. a second PC-IGBT n-type region in the PC-IGBT tub overlapping both said first PC-IGBT n-type region of the PC-IGBT tub and the third PC-IGBT p-type region of the PC-IGBT tub,
      iii. a third PC-IGBT n-type region in the PC-IGBT tub substantially contained within said second PC-IGBT p-type region to form part of the PC-IGBT drain, and h. depositing a conductive metal over the resulting structure and patterning the conductive metal to produce contacts for the source, said MOS gate and drain of both the said PC-IGBT and the said NC-IGBT.

2. The process of claim 1 further including the simultaneous formation of at least one PMOS device and at least one DMOS device in said plurality of dielectrically isolated n-type tubes.

* * * * *